United States Patent
Shutou et al.

[11] Patent Number: 5,983,995
[45] Date of Patent: Nov. 16, 1999

[54] RADIATOR

[75] Inventors: Akimi Shutou; Takashi Doi, both of Osaka, Japan

[73] Assignee: Diamond Electric Mfg. Co., Ltd., Osaka, Japan

[21] Appl. No.: 08/919,446

[22] Filed: Aug. 28, 1997

[30] Foreign Application Priority Data

Sep. 2, 1996 [JP] Japan .................................. 8-252322

[51] Int. Cl.⁶ .................................................. F28D 15/00
[52] U.S. Cl. ................... 165/104.33; 165/183; 165/185; 165/171; 165/80.3; 29/890.038; 29/890.04; 29/890.03
[58] Field of Search .............................. 165/80.3, 104.33, 165/171, 183; 29/890.038, 890.04, 890.03, 890.054, 508, 520

[56] References Cited

U.S. PATENT DOCUMENTS

| | | | |
|---|---|---|---|
| 2,732,615 | 1/1956 | Sandberg | 29/890.03 |
| 2,867,417 | 1/1959 | Axlander | 165/171 |
| 2,944,138 | 7/1960 | Goff | 165/171 |
| 3,387,653 | 6/1968 | Coe | 165/104.33 |
| 4,026,006 | 5/1977 | Moebius | 29/508 |
| 4,160,476 | 7/1979 | Ashton et al. | 165/171 |
| 5,025,546 | 6/1991 | Gotoh et al. | 29/508 |
| 5,070,606 | 12/1991 | Hoopman et al. | 29/890.03 |
| 5,549,155 | 8/1996 | Meyer, IV et al. | 165/104.33 |
| 5,725,050 | 3/1998 | Meyer, IV et al. | 165/104.33 |
| 5,826,645 | 10/1998 | Meyer, IV et al. | 165/104.33 |

FOREIGN PATENT DOCUMENTS

| | | | |
|---|---|---|---|
| 3123-602 | 4/1982 | Germany | 165/104.33 |

*Primary Examiner*—Ira S. Lazarus
*Assistant Examiner*—Terrell McKinnon
*Attorney, Agent, or Firm*—Liniak, Berenato, Longacre & White

[57] ABSTRACT

A structure of a heat receiving member of a radiator that includes a heat receiving member, a heat pipe, and a heat radiating member is characterized as follows. In such radiator, the heat receiving member has a heat pipe insertion groove for allowing one end of the heat pipe to be disposed on part of the heat receiving member. After the heat pipe has been inserted into the heat pipe insertion groove, the heat pipe insertion groove is press-worked, whereby the heat receiving member is joined to the heat pipe.

6 Claims, 3 Drawing Sheets

RADIATOR

BACKGROUND OF THE INVENTION

The invention relates to radiators for electronic equipment, and more particularly to a radiator that has a heat receiving member and a heat radiating member and that interposes a heat pipe between the heat receiving member and the heat radiating member. Further more specifically, the invention is directed to a structure for mounting a heat receiving member and a heat pipe.

As radiators used for electric and electronic equipment, the following construction that can effectively radiate heat of a heating body has heretofore been proposed. A heat receiving member is mounted on a heating body; one end of a heat pipe is either closely fitted with or embedded in one end of the heat receiving member; and the other end of the heat pipe is mounted on a heat sink or other heat radiating parts. In this case, a radiator includes: a heat receiving member, a heat pipe serving as a heat conducting member, and a heat radiating member.

In the aforementioned conventional radiator, such means as shown in FIGS. 4 and 5 is extensively employed to join one end of the heat pipe to the heat receiving member. In FIG. 4, a heat receiving member 10 is formed by bending one side of a flat, good heat conducting metal plate and by wrapping such bent member around one end of a heat pipe 20. Further, a heat receiving member 10 shown in FIG. 5 is formed by arranging one end of a heat pipe 20 on the upper surface of the heat receiving member 10 and by joining members close to both contact members with a solder 80, so that heat conduction is provided between the heat receiving member 10 and the heat pipe 20.

However, in the thus constructed radiators, the structure and shape of the joined member between the heat pipe and the heat receiving member become complicated in relation to the overall designing of the equipment on which the radiator is mounted. Therefore, in the device shown in FIG. 4, not only the quality of solid contact between the heat pipe and the heat receiving member varies during mass-production process, but also desired heat radiating effects may not, in some cases, be obtained due to the fact that the heat receiving member contacts the heat pipe only in part of one end of the heat pipe. In addition, the device shown in FIG. 5 involves the cumbersome soldering operation. Therefore, in the aforementioned conventional radiators, it is difficult to produce an inexpensive radiator that can simultaneously satisfy needs for improved productivity and heat conductivity.

SUMMARY OF THE INVENTION

The invention has been made in view of the aforementioned problems. The object of the invention is, therefore, to provide inexpensively a flat radiator having excellent productivity and heat conductivity.

To achieve the above object, the invention is applied to a structure of a heat receiving member of a radiator that includes a heat receiving member, a heat pipe, and a heat radiating member. In such radiator, the heat receiving member has a heat pipe insertion groove for allowing one end of the heat pipe to be disposed on part of the heat receiving member, and after the heat pipe has been disposed on the heat pipe insertion groove, the heat pipe insertion groove is press-worked, whereby the heat receiving member is joined to the heat pipe.

DETAILED DESCRIPTION OF THE PREFERRED EMBODIMENTS

Figure 1:
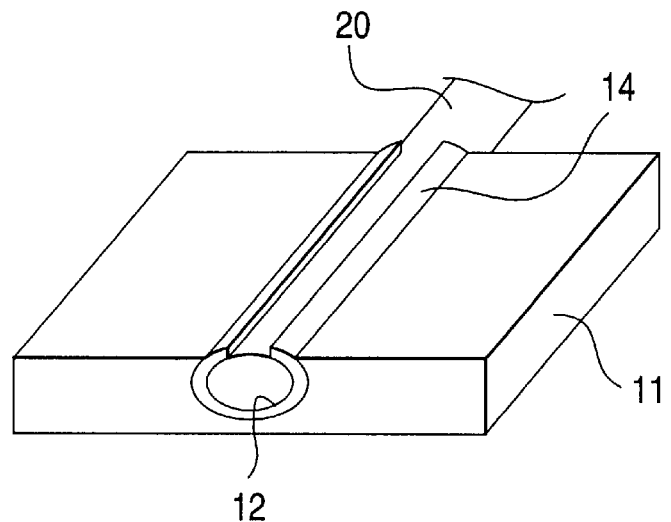
FIG. 1 is a perspective view of a joined member between a heat pipe and a heat receiving member, which is a first embodiment of the invention.
Figure 2:
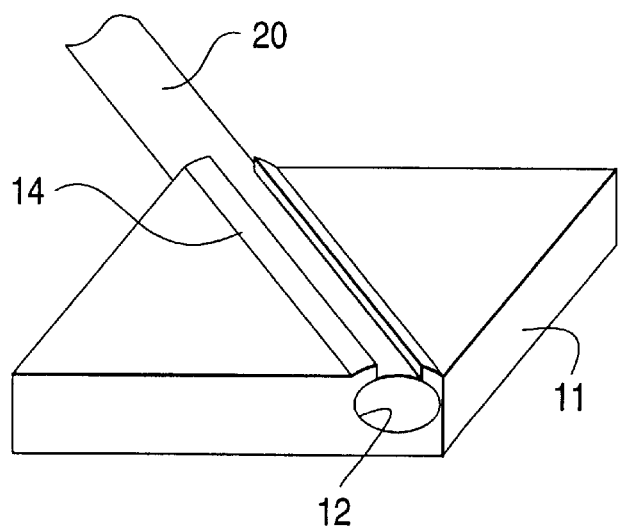
FIG. 2 is a perspective view of a joined member between a heat pipe and a heat receiving member, which is a second embodiment of the invention.
Figure 3:
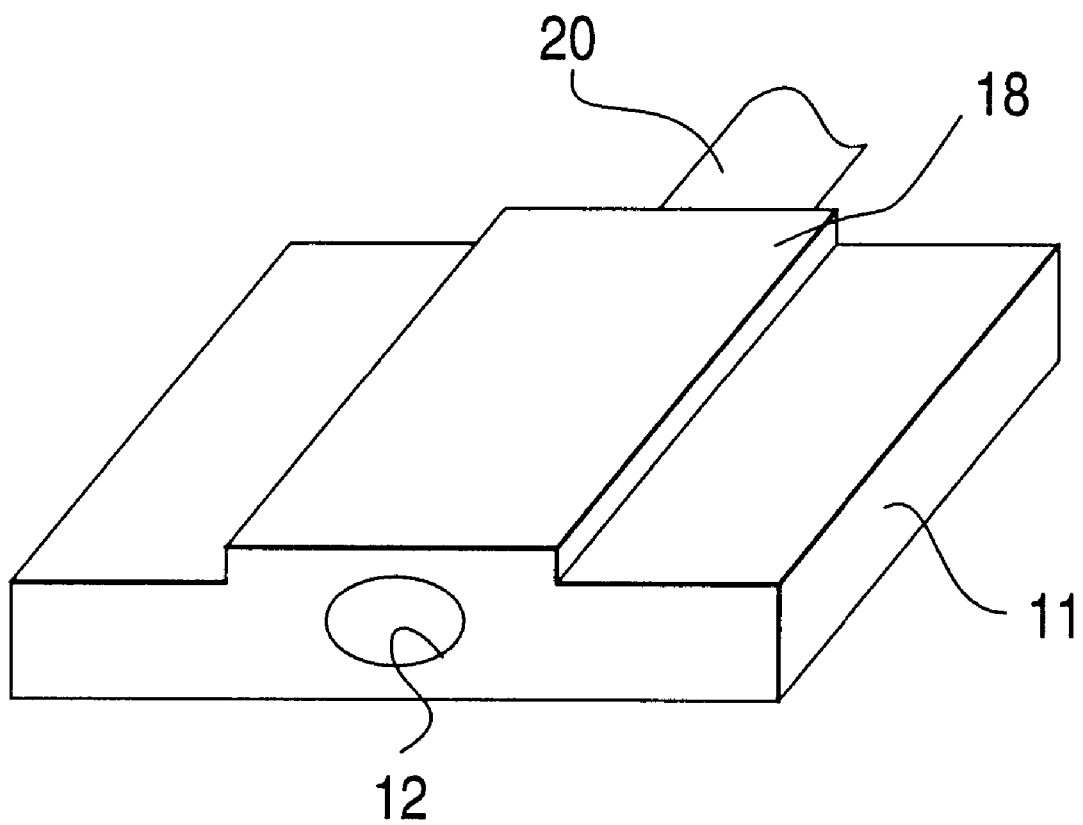
FIG. 3 is a perspective view of a joined member between a heat pipe and a heat receiving member, which is a third embodiment of the invention.
Figure 4:
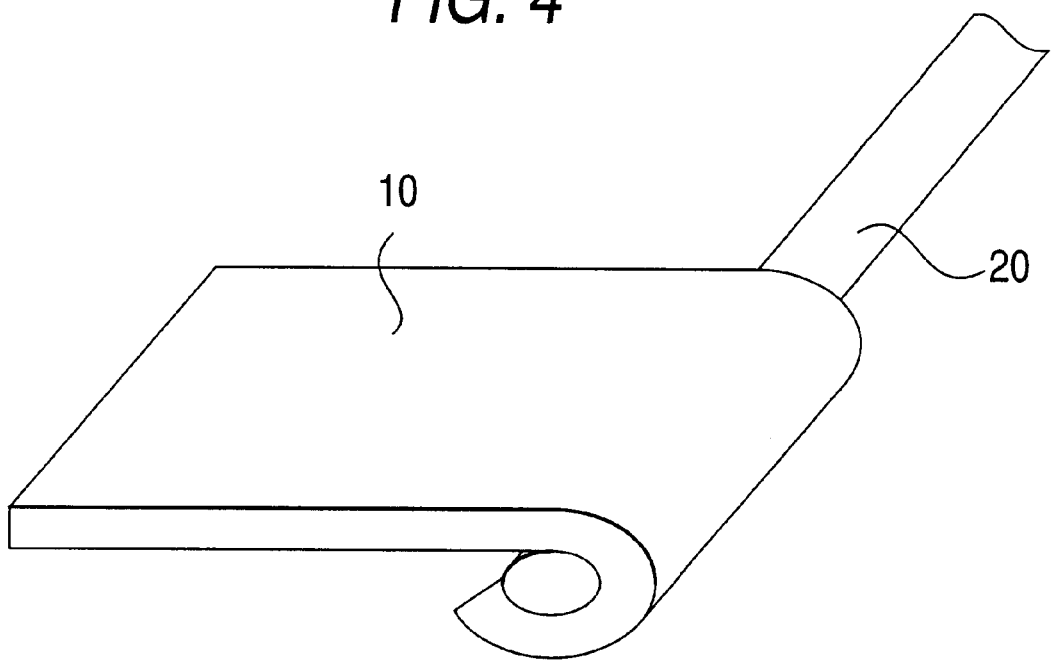
FIG. 4 is a perspective view showing a conventional joined member between a heat pipe and a heat receiving member.
Figure 5:
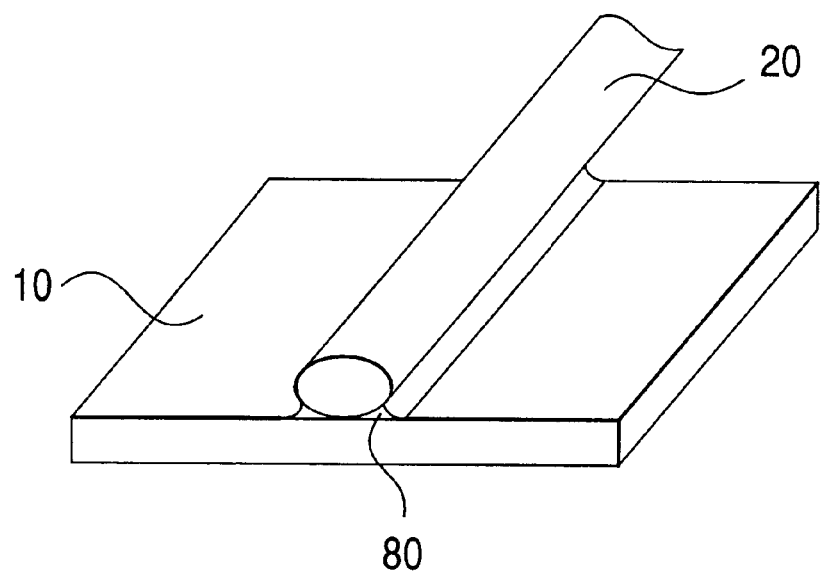
FIG. 5 is a perspective view showing another conventional joined member between a heat pipe and a heat receiving member.

Embodiments of the invention will now be described with reference to FIGS. 1 to 3. FIG. 1 is a perspective view of a joined member between a heat pipe and a heat receiving member, which is a first embodiment of the invention; FIG. 2 shows a second embodiment; and FIG. 3 shows a third embodiment. First, in FIG. 1, a heat receiving member 11 has a heat pipe insertion groove 12 that extends across the width in the middle of the upper surface of a flat metal plate. The heat pipe insertion groove 12 allows a heat pipe 20 to be inserted thereinto and joined thereto. Heat pipe fixing members 14 are also arranged on the upper portion of the heat pipe insertion groove 12 so as to extend along the length of the heat pipe insertion groove 12. The heat pipe fixing members 14 make the joined member between the heat receiving member 11 and the heat pipe 20 reliably rigid after the heat pipe 20 has been inserted. The frontal cross section of the heat pipe insertion groove 12 including the heat pipe fixing members 14 of the heat receiving member 11 in the aforementioned construction is, before the heat pipe 20 is inserted, substantially baglike so as to prevent the heat pipe 20 from being released. After the heat pipe 20 has been inserted, the heat pipe fixing members 14 are pressed from above, so that the heat pipe 20 is pressed onto the heat pipe insertion groove 12 and deformed so as to be flat. As a result, not only the heat pipe 20 can be fixed reliably, but also the outer circumference of the heat pipe can be fitted closely with the heat receiving member 11.

FIG. 2 will be described next. The second embodiment is characterized in that a heat pipe insertion groove 12 extends diagonally in contrast to the heat pipe insertion groove 12 shown in FIG. 1 that extends across the width in the middle. Since the construction of the second embodiment is the same as or equivalent to that shown in FIG. 1 other than the mode of arrangement of the heat pipe insertion groove 12, a description of the second embodiment will be omitted.

Further, a heat receiving member 11 such as shown in FIG. 3 is proposed as the third embodiment. Referring to FIG. 3, a heat pipe insertion groove 12 is formed so that the diameter thereof is so large as to allow one end of a heat pipe 20 to be inserted thereinto with ease. A press fixing surface 18 is formed on the upper surface of the heat pipe insertion groove 12. The press fixing surface is formed so as to be slightly higher than the upper surface of the heat receiving member 11, the height ranging, e.g., from 0.1 to 0.2 mm. During the assembling process, the press fixing surface 18 is pressed down from above by a dimension equivalent to the step, so that the heat pipe 20 is closely fitted with the heat receiving member 11. As a result, the flatness of the upper surface of the heat receiving member 11 can be improved. While the raised fixing surface 18 in FIG. 3 is defined by a step, a smooth archlike press fixing surface may also be formed in place of the step. That is, the heat receiving members 11 shown in FIGS. 1, 2, and 3 may take any arbitrary positions, shapes, and numbers as long as one end of the heat pipe 20 can be closely fitted with the heat pipe insertion groove 12 by press working.

As a result of the aforementioned constructions, the heat pipe 20 can be connected to the heat receiving member 11 more easily as well as more reliably than the conventional examples. That is, one end of the heat pipe 20 and the heat receiving member 11 are flatly fixed by press-working the heat receiving member 11. Therefore, not only the entire part of the heat receiving member can be press-worked into a thin body, but also the heat pipe 20 can be inserted with ease during the assembling process. Further, after the assembling process, the heat pipe 20 is inserted into the middle member of the heat receiving member through which effective heat conduction can be implemented. Therefore, an efficient radiator can be provided.

What is claimed is:

1. A radiator comprising:
   a heat receiving member,
   a heat pipe, and
   a heat radiating member,
   wherein
   said heat receiving member includes a heat pipe insertion groove for allowing one end of said heat pipe to be disposed thereon; and
   after said heat pipe has been disposed on the heat pipe insertion groove, the heat pipe insertion groove is press-worked so that said heat receiving member is joined to said heat pipe, wherein
   heat pipe fixing members are provided on an upper portion of the heat pipe insertion groove; and
   after said heat pipe is disposed on the heat pipe insertion groove, said heat pipe fixing members are press-worked so that said heat receiving member is joined to said heat pipe.

2. A radiator comprising:
   a heat receiving member,
   a heat pipe, and
   a heat radiating member,
   wherein
   said heat receiving member includes a heat pipe insertion groove for allowing one end of said heat pipe to be disposed thereon; and
   after said heat pipe has been disposed on the heat pipe insertion groove, the heat pipe insertion groove is press-worked so that said heat receiving member is joined to said heat pipe,
   wherein
   a press fixing surface is provided on an upper portion of the heat pipe insertion groove; and
   after said heat pipe is disposed on the heat pipe insertion groove, said press fixing surface is press-worked so that said heat receiving member is joined to said heat pipe.

3. A radiator comprising:
   a heat receiving member,
   a heat pipe, and
   a heat radiating member,
   wherein
   said heat receiving member includes a heat pipe insertion groove for allowing one end of said heat pipe to be disposed thereon; and
   after said heat pipe has been disposed on the heat pipe insertion groove, the heat pipe insertion groove is press-worked so that said heat receiving member is joined to said heat pipe,
   wherein
   a cross section of the heat pipe insertion groove has a baglike shape.

4. A method of forming a radiator assembly having a heat receiving member and a heat pipe, said method comprising the steps of:
   forming a longitudinal groove along a substantially flat surface of said heat receiving member such that said groove has a depth substantially corresponding to a thickness of said heat pipe and an internal surface substantially corresponding to an external surface of said heat pipe and forming opposing heat pipe fixing members disposed along and on opposite sides of said groove such that said heat pipe fixing members extend above said substantially flat surface;
   inserting said heat pipe within said groove; and
   press working said heat pipe fixing members from above said heat receiving member so that said heat pipe is pressed into said groove thereby deforming said heat pipe fixing members to retain said heat pipe within said groove and slightly deforming said heat pipe thereby increasing a contact interface between said external surface of said heat pipe and said internal surface of said groove.

5. A radiator comprising:
   a heat pipe having a predetermined width;
   a heat receiving member, said heat receiving member having a longitudinal groove formed on an upper substantially flat surface thereof, said groove having a depth substantially corresponding to said width of said heat pipe and a pair of opposing longitudinal fixing members formed along a boundary between said groove and said substantially flat surface, wherein
   said heat pipe is disposed within said groove and contacts a bottom surface of said groove thereby preventing said heat pipe from extending substantially beyond said substantially flat surface of said heat receiving member and said fixing members are press worked from directly above said substantially flat surface of said heat receiving member thereby retaining said heat pipe within said groove and deforming said heat pipe to increase a contact surface between said external surface of said heat pipe and said internal surface of said groove.

6. A method of forming radiator assembly comprising a heat pipe having a predetermined width, and a heat receiving member having a substantially plate shape and a raised step portion such that said heat receiving member and step portion has a thickness larger than said width of said heat pipe, said method comprising the steps of:
   forming a longitudinal bore extending through said heat receiving member and said raised step portion parallel to an external surface of said raised step portion,
   inserting said heat pipe within said longitudinal bore, and
   press working said raised step portion of said heat receiving member thereby slightly deforming said raised step portion to retain said heat pipe within said longitudinal bore and slightly deforming said heat pipe to increase a contact surface between said heat pipe and an internal surface of said longitudinal bore.

* * * * *